United States Patent [19]

Millen

[11] Patent Number: 4,984,292

[45] Date of Patent: Jan. 8, 1991

[54] BANDPASS AMPLIFIER AND RECEIVER USING BANDPASS AMPLIFIER

[75] Inventor: Ted I. Millen, Don Mills, Canada

[73] Assignee: Correpro (Canada) Inc., Scarborough, Canada

[21] Appl. No.: 250,071

[22] Filed: Sep. 28, 1988

[51] Int. Cl.$^5$ ............................................. H04B 13/02
[52] U.S. Cl. ........................................ 455/40; 455/57; 455/339; 330/107; 330/109; 330/294; 307/520
[58] Field of Search ............... 330/107, 109, 294, 303, 330/306; 307/520; 333/176; 328/167; 455/339, 40–41, 39, 57

[56] References Cited

U.S. PATENT DOCUMENTS

| | | | |
|---|---|---|---|
| 3,906,390 | 9/1975 | Rollett | 330/107 |
| 3,950,711 | 4/1976 | Ohkawa | 330/107 |
| 3,987,370 | 10/1976 | Schutz | 330/107 |
| 4,087,737 | 5/1978 | De Gennaro | 330/107 |
| 4,164,715 | 8/1979 | Thurmond | 330/109 |
| 4,189,681 | 2/1980 | Lawson et al. | 330/109 |
| 4,403,201 | 9/1983 | Yokoyama | 330/306 |
| 4,777,652 | 10/1988 | Stolarczyk | 455/41 |

Primary Examiner—Reinhard J. Eisenzopf
Assistant Examiner—Andrew Faile

[57] ABSTRACT

The present application relates to an active bandpass amplifier comprising a single stage operational amplifier, a bridged "T" network single frequency elimination filter in the negative feedback path of the amplifier and a phase shift correcting capacitor associated with the bridged "T" network single frequency elimination filter to effect a phase shift sufficient to maintain an appropriate feedback such that the amplifier is stable. The bridged "T" network single frequency elimination filter in conjunction with the circuit capacities and phase shifts in the integrated circuits introduces a phase shift which would result in the amplifier oscillating when the network is placed in the feedback path and the corrective capacitor effects a corrective phase shift to render the amplifier stable. Such a bandpass amplifier allows high gain and high "Q" and the gain is many times higher than that of a conventional single stage amplifier where gain is typically limited to approximately 5 and the "Q" is limited to about 25. In the present case, this bandpass amplifier is capable of gains of greater than 10 and substantially higher "Q". Such an amplifier is advantageously used in a receiver and in a signalling system. The high gain capablility of the receiver is particularly advantageous in a mining environment where the receiver can be used as part of a signalling system.

37 Claims, 4 Drawing Sheets

BANDPASS AMPLIFIER AND RECEIVER USING BANDPASS AMPLIFIER

BACKGROUND OF THE INVENTION

This invention relates to a new and improved active bandpass filter and, in particular, the application thereof in a receiver and signalling system.

Current practice in bandpass active filters uses the "POLE and ZERO" mathematical concept to design a multistage filter. In these cases, the practical individual stage gain is limited to approximately five times and the "Q" of the stage is normally limited to about 25. Information on prior art active filters can be found in the book "Active Filters" by Don Lancaster, Howard W. Sams, Division of Macmillan Inc.

The use of a bridged "T" network as a bandpass elimination filter or notch filter is well known. This network is able to eliminate a particular frequency, and circuits of this type are described in "Reference Data for Radio Engineers" by ITT.

SUMMARY OF THE INVENTION

According to the present invention, it has been found that this bridged "T" network can advantageously be combined with a single stage operational amplifier. By placing the network in the negative feedback path of the amplifier, one would expect that at the notch frequency or bandpass frequency the negative feedback would disappear and the full gain of the amplifier would produce a bandpass amplifier at the notch frequency. It has been found that the bridged "T" network in conjunction with the circuit capacities and phase shifts in the integrated circuits introduces a phase shift and thus the feedback, instead of being negative, becomes positive and the amplifier turns into an oscillator. This problem is overcome in the present invention by the addition of a capacitor to correct the phase shift introduced by the bridged "T" network which then allows the circuit to function for its intended purpose. Among other advantages, the gain of the amplifier is several orders of magnitude higher than conventional circuits with corresponding high "Q" equivalent.

According to an aspect of the invention, a further capacitor is combined in the circuit which allows further increases in the gain. This additional capacitor is preferably adjustable and to a limited extent counteracts the addition of the first capacitor, but only to a controlled extent which allows the amplifier to remain stable. Thus, this additional capacitor significantly increases the gain of the single stage operational amplifier.

BRIEF DESCRIPTION OF THE DRAWINGS

Preferred embodiments of the invention are shown in the drawings, wherein.

DETAILED DESCRIPTION OF THE PREFERRED EMBODIMENT

Figure 1:
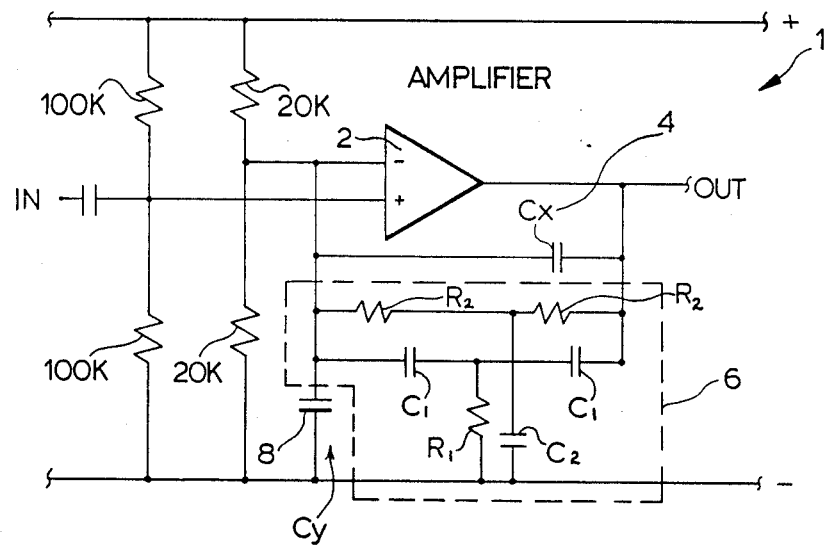
FIG. 1 is a schematic of the bandpass amplifier.

The bandpass amplifier generally shown as 1 comprises a single stage operational amplifier 2 in combination with a bridged "T" network generally shown in the dotted box labelled 6. A phase shift correcting capacitor 4 is placed in parallel with the bridged "T" network band elimination filter 6. The bridged "T" network band elimination filter 6 is placed in the negative feedback path of the single stage operational amplifier 2 and this network and associated circuit capacities and operational amplifier phase shift introduce an overall loop phase shift which renders the amplifier unstable at or near the bandpass frequency.

By selecting the appropriate correcting capacitor 4, the amplifier can be rendered stable at the bandpass frequency and thus, the circuit operates in the desired manner. An increase in the gain can be achieved by using the additional capacitor 8, which partially counteracts in a controlled manner the effect of the correcting capacitor to produce a regenerative gain. Obviously the value of the additional capacitor 8 is selected in accordance with the correcting capacitor 4 to assure that the amplifier remains stable.

The bridged "T" network band elimination filter includes two resistors shown as R2, two capacitors shown as C1 and a further resistor R1 and capacitor C2. With R2 equal to 16.5K and C1 equals 0.015 uF with R2 equalling two R1 and C2 equalling two C1 the frequency is determined by the formula $F=1/(2\pi\ C1\ R2)$ which, in this case, results in a frequency of 643 Hz. Obviously the values can be selected to determine the particular frequency desired. The gain of this particular amplifier is several hundred times and by the appropriate selection of the correcting capacitor 4 and the additional capacitor 8, a gain of several thousand times is possible. This is in contrast to conventional bandpass filters which use the "POLE and ZERO" mathematical concept in a multistage filter where the individual stage gain is limited to about five times and the "Q" of the stage is normally limited to about 25.

Figure 2:
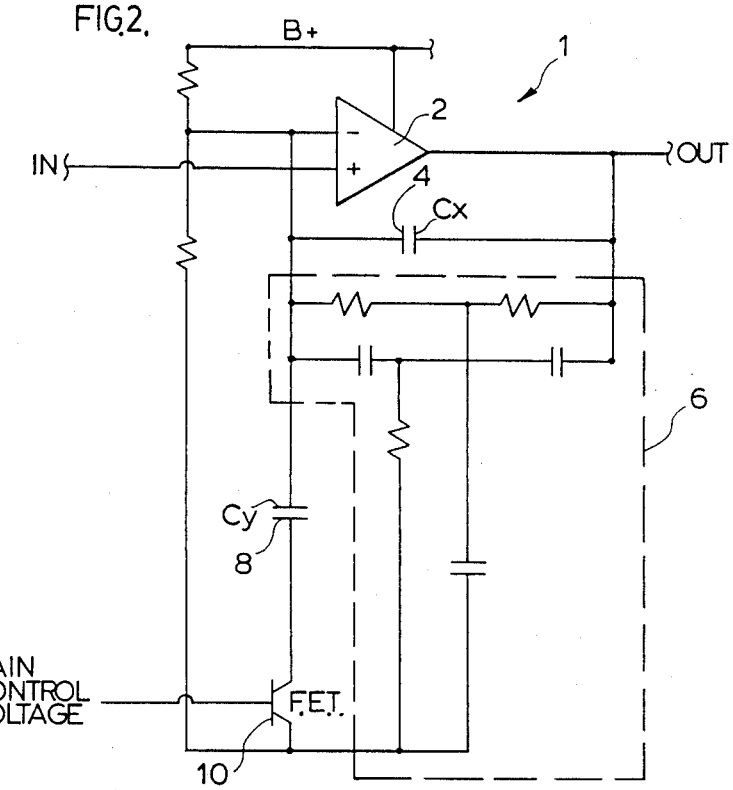
FIG. 2 is a modified bandpass amplifier with controlled regenerative gain.

In FIG. 2 a slightly modified version of the bandpass amplifier is shown where, in addition to the additional capacitor 8, a field effect transistor 10 or other suitable transistor is introduced for controlling the effect of the additional capacitor C8. This allows gain control as the effective capacitance of the additional capacitor 8 can be varied by adjusting the field effect transistor to produce a controlled regenerative gain.

The above circuit arrangements have practical advantages in that the series resistors of the network also provide the direct current path to stabilize the amplifier at D.C., the biasing resistors also provide the network termination as well as the direct current return for the D.C. feedback. The positive input biasing resistors can be of high value, thus making the circuit easy to drive. This is in contrast to conventional circuits which are often difficult to drive due to low impedance.

The present circuit uses a single power supply, however a dual power supply could be used, in which case single resistors are returned to neutral providing the same network termination as well as the direct current return for D.C. feedback.

The amplifier has many applications in selective amplifier use where high gain, high "Q", stable operation and low current drain are important. The performance of this amplifier is comparable with a multistage filter using prior current practice.

In some cases, it has been necessary to add a small capacitor to the compensation pins of the operational amplifier to reduce its internal band width in order to eliminate very high frequency parasitic oscillations.

Figure 5:
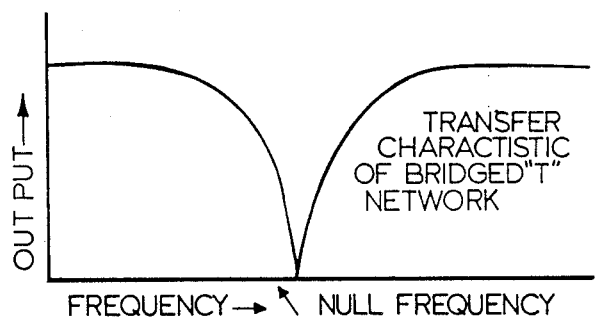
FIG. 5 illustrates the transfer characteristics of the bridged "T" netork.
Figure 6:
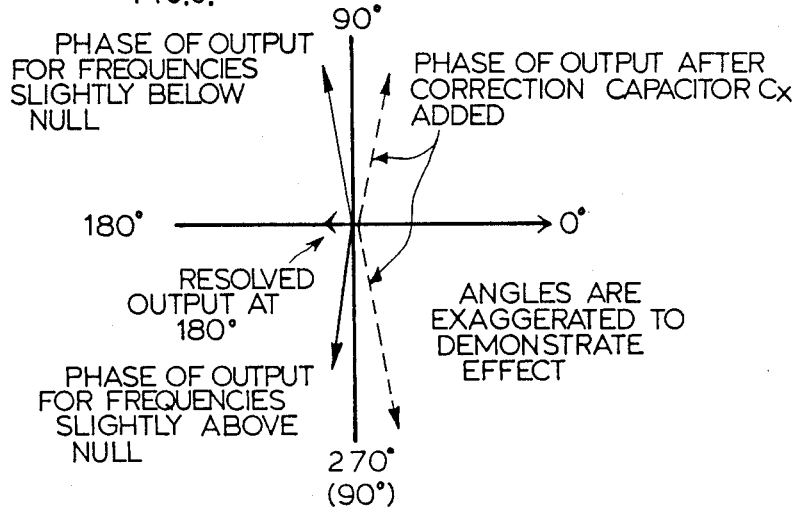
FIG. 6 is a phase diagram.

With reference to FIGS. 5 and 6, for frequencies slightly above or slightly below the null of the bridged "T" network, the loop phase is slightly advanced or retarded to the plus or minus 90° mark, with reference to 0°, thus a small but significant resolve component exists at 180°. This component is again reversed to 0° by the phase inversion of the operational amplifier which would place the feedback in phase with the input if the correcting capacitor was not present. If the loop gain around the network and the amplifier is greater than one, the amplifier will oscillate. Considering the operational amplifier gain is in the order of a few hundred, a very small resolve component at 180° will cause the amplifier to oscillate and this is what happens in practice.

The addition of the correcting capacitor 4 moves the loop phase vectors to the zero phase side to the plus or minus 90°, which eliminates the resolve vector at 180° and the active filter becomes stable. In practice, this capacitor is a fraction of the size of the bridged "T" capacitors.

The addition of the capacitor 8 works to counteract the correcting capacitor in a controlled way which, if the correct ratio between capacitors is maintained, an amount of resolved 180° input can be added to increase gain while maintaining a loop gain of less than one. In this manner, a regenerative gain can be achieved which is quite stable and is greater than the open loop gain of the operational amplifier. A variable resistor or the equivalent in a solid state device such as a transistor placed in series with the capacitor will allow the regenerative gain to be controlled. A fixed amount of regenerative can be added by selecting a suitable value of capacitor.

Figure 4:
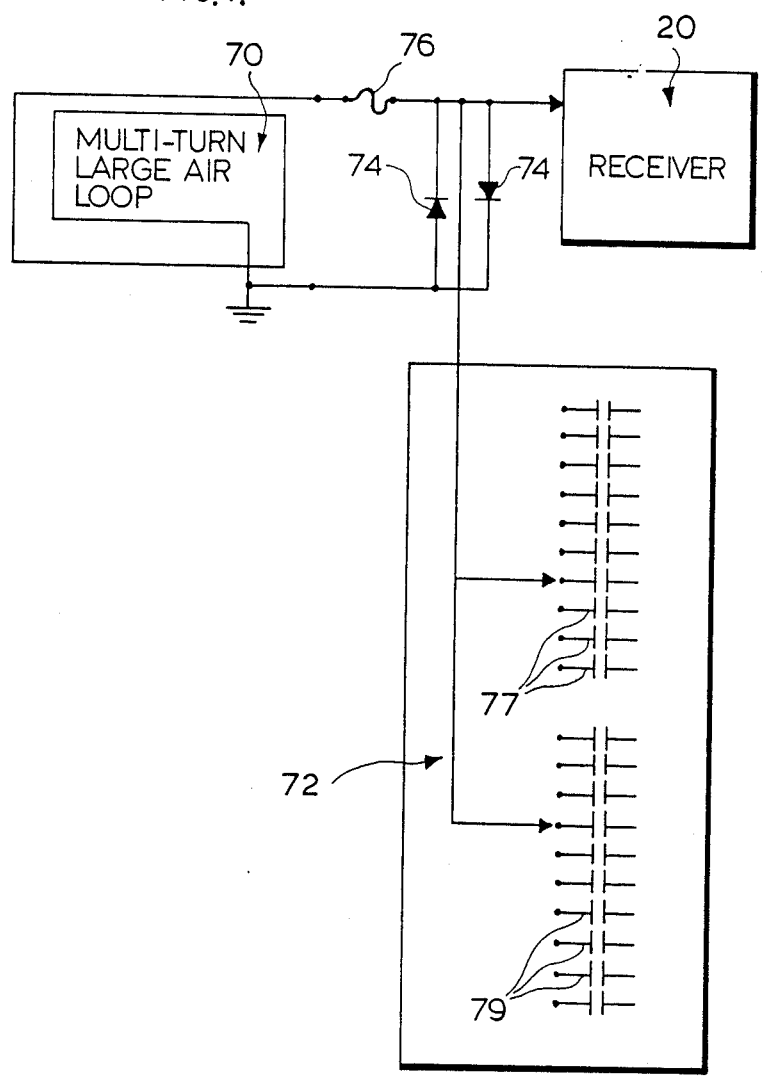
FIG. 4 shows the receiver in combination with a large diameter air loop antenna.

A typical application of the high gain bandpass amplifier is shown in the schematic diagram of FIG. 4 illustrating a 650 Hz receiver 20 for use in very low frequency communications generated by signal generator 60 provided at the surface of a mine. Signal generator 60 includes a frequency generator 62, in this case generating a signal having a frequency of 650 Hz which is transmitted by the very large wire loop 64. This results in a low frequency signal which can be received throughout an extensive mine due to the excellent transmission of this signal through the substrate. The loop can be very long or several signal generators could be used and/or at different levels in the mine frequencies of between 500 and 3,000 Hz are particularly suitable for mining applications and it is preferred that the amplifiers have a gain of at least 100.

The signal is picked up by the resonant ferrite loop antenna 22 and passed to the 650 Hz high gain bandpass amplifier, stabilized by capacitor C4. The amplifier is tuned to the 650 Hz by adjusting the variable resistor R5 in the bridged "T" network. This amplified signal is passed on to the mixer 30, where it is mixed with the local oscillator signal of 1000 Hz produced by oscillator 32 to produce upper and lower side bands, the upper of which is at 1650 Hz. This 1650 Hz signal is amplified by the second high gain bandpass amplifier 40 which is enhanced in gain by the addition of capacitor C12. The output of this amplifier is detected and passed on to a detector and driving circuit 48 connected to the D.C. meter indicator 50 or other signalling devices.

The net result is a two-stage receiver with a sensitivity better than 1 microvolt and a band width of 3 Db points of 14 Hz. The rejection at frequencies further from resonance is greater than 100/1. The use of an up converter superheterodyne eliminates feedback from the output stage to the input and produces overall stability.

Figure 3:
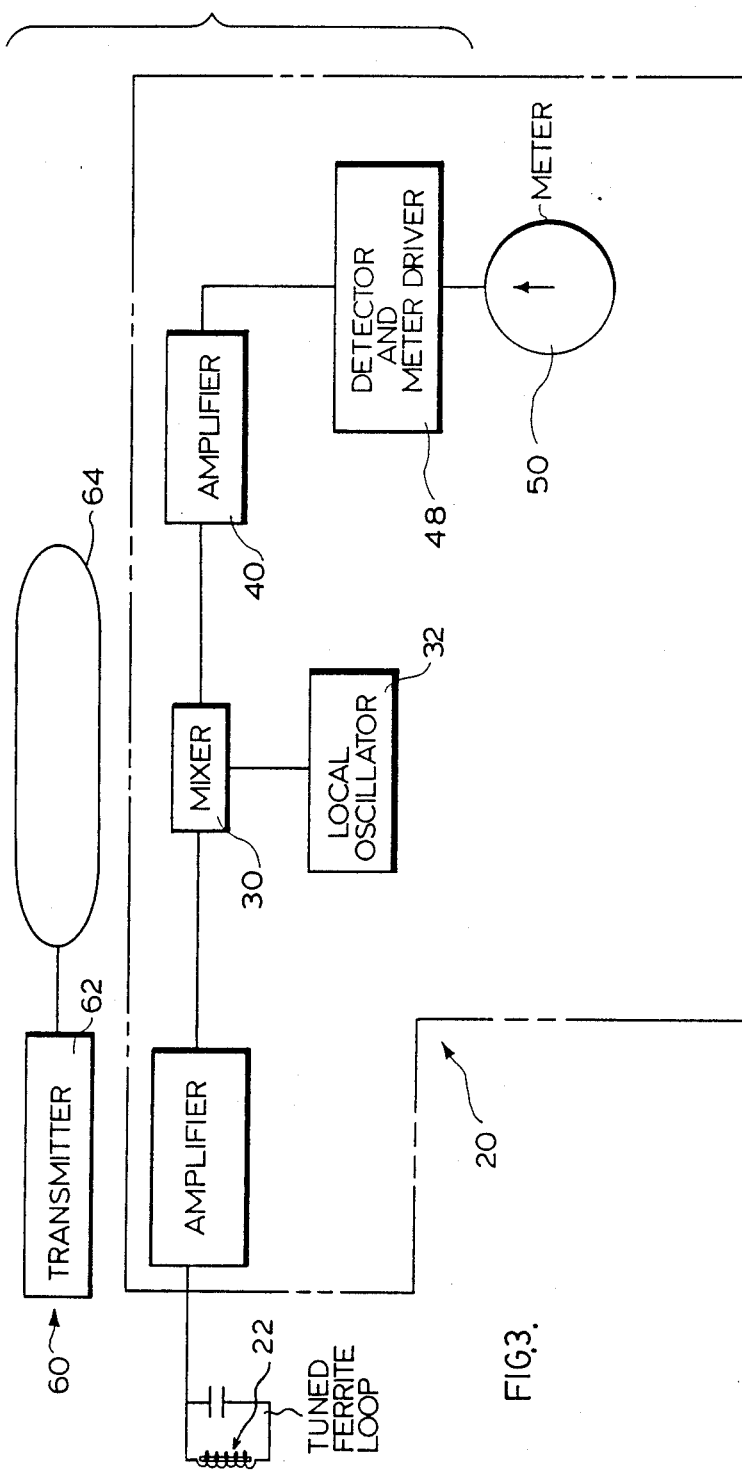
FIG. 3 is a block diagram of a receiver in association with a surface signal generator.

In FIG. 4, the receiver 20 has been combined with a multi turn large air loop antenna 70 which is turnable by means of the variable capacitance device 72. Diodes in combination with the fuse 76 serve to protect the receiver from damage due to lightning. This large air loop and capacitor arrangement replaces the resonant ferrite loop antenna 22 of FIG. 3. Tuning the antenna is accomplished by varying the capacitance by means of individual capacitors 77. Fine tuning is possible by selecting one of the smaller capacitors 79. The receiver and antenna arrangement of FIG. 4 is useful in a system where the miners or other source are able to transmit low frequency signals to be received by the receiver.

It can be appreciated that this particular high gain, high "Q" bandpass amplifier can be used in many applications; it is not limited to the particular receiver disclosed.

In some mining applications it is desirable to provide the miner or group of miners with a transmitter and use a large loop above the mine or at various levels thereof as a receiver. The receiver again uses the high gain, high "Q" capabilities of the amplifier to provide an effective system. The transmitters can operate on a portable power supply and again use the particular amplifier. A coding or frequency shift keying arrangement can be used to allow coding of messages. In this way, two way communication can be provided where each miner has a personal receiver and a group of miners can share a battery powered transmitter. The circuitry for such a receiver is the same as that previously described, however, the antennae would be a large loop. The miner's transmitter preferably has the capability for transmitting at two different frequencies to allow appropriate coding.

Therefore, the receiver, because of its high gain capability, can be used as a personal warning system for a miner or other individual and/or can be used as a stationary receiver.

The low frequencies described are particularly suited for the underground mine environment, however, it is apparent the system, receiver, and the transmitter can operate at other frequencies and in other environments. Depending upon the particular application, a preferred frequency range is often apparent.

Although various preferred embodiments of the present invention have been described herein in detail, it will be appreciated by those skilled in the art, that variations may be made thereto without departing from the spirit of the invention or the scope of the appended claims.

The embodiments of the invention in which an exclusive property or privilege is claimed are defined as follows:

1. A bandpass amplifier comprising a single stage operational amplifier, a bridged "T" network band elimination filter in a negative feedback path of said amplifier, and a phase shift correcting capacitor associated with said bridged "T" network band elimination filter to effect a phase shift sufficient to maintain an appropriate feedback such that said amplifier is stable.

2. A bandpass amplifier as claimed in claim 1 wherein said capacitor is placed in parallel with said bridged "T" network band elimination filter.

3. A bandpass amplifier as claimed in claim 1, further including an additional capacitor which partially counteracts the effect of said correcting capacitor to effect a regenerative gain of a magnitude to maintain said amplifier stable.

4. A bandpass amplifier as claimed in claim 3, including means associated with said additional capacitor to vary the extent of the regenerative gain.

5. A bandpass amplifier as claimed in claim 4, wherein said means associated with said additional capacitor is a variable resistor.

6. A bandpass amplifier as claimed in claim 4, wherein said means associated with said additional capacitor is a field effect transistor.

7. A bandpass amplifier as claimed in claim 1, having a gain in excess of about 10.

8. A bandpass amplifier as claimed in claim 4, having a gain in excess of about 10.

9. A bandpass amplifier as claimed in claim 1, capable of a gain in the range of about 20 to 300.

10. A bandpass amplifier as claimed in claim 4, capable of a gain in the range of about 20 to 300.

11. A bandpass amplifier as claimed in claim 1, having a gain in excess of 20 and a "Q" in excess of 30.

12. A bandpass amplifier as claimed in claim 4, having a gain in excess of 20 and a "Q" in excess of 30.

13. A bandpass amplifier as claimed in claim 1, having a gain in excess of 20 and a "Q" in excess of about 100.

14. A bandpass amplifier as claimed in claim 4, having a gain in excess of 20 and a "Q" in excess of about 100.

15. A bandpass amplifier as claimed in claim 1, having a gain of at least about 100 and a "Q" of 100 or more.

16. A bandpass amplifier as claimed in claim 4, having a gain of at least about 100 and a "Q" of 100 or more.

17. A bandpass amplifier comprising in combination a single stage operational amplifier, a bridged "T" network band eliminator filter, and a phase shift correcting capacitor,
said bridged "T" network band elimination filter cooperating with said single stage amplifier to provide negative feedback for said amplifier, said network and said amplifier introducing an undesired phase shift of the feedback signal,
said correcting capacitor cooperating with said amplifier and said bridged "T" network band elimination filter to introduce a phase shift to compensate for the phase shift introduced by said bridged "T" network and said amplifier of sufficient magnitude to render said amplifier stable.

18. A bandpass amplifier as claimed in claim 17, including a further capacitor associated with said correcting capacitor, which introduces a further controlled phase shift of a magnitude and direction to increase gain of the amplifier without causing instability.

19. A receiver comprising an antenna, a first bandpass amplifier, a mixer having an associated local oscillator, a second bandpass amplifier and detector means for determining whether a particular signal has been received,
said first and second bandpass amplifiers each comprising a single stage operational amplifier, a bridged "T" network band elimination filter in a negative feedback path of said amplifier, and a phase shift correcting capacitor associated with said bridged "T" network band elimination filter to effect a phase shift sufficient to maintain an appropriate feedback such that said amplifier is stable.

20. A receiver as claimed in claim 19, wherein said antenna is a tuned ferrite loop tuned in accordance with the characteristics of said first amplifier.

21. A receiver as claimed in claim 19, wherein said first amplifier provides a gain in excess of 100.

22. A receiver as claimed in claim 21, wherein said oscillator has a frequency of about 1000 Hz and said second amplifier amplifies the signal having a frequency of about 1650 Hz producing a gain in excess of 200.

23. A receiver as claimed in claim 22, wherein said first amplifier has a gain in excess of 300 and said second amplifier has a gain in excess of 1000 and each having a "Q" in excess of 30.

24. A signalling system for use in alerting miners in underground mine comprising
means for generating an alarm signal at a low frequency for propogation through the mine, and
a plurality of personal receivers each associated with a miner and operable from a portable battery supply carried by the miner, each receiver including an antenna tuned to the particular low frequency of the alarm signal and at least one bandpass amplifier comprising a single stage operational amplifier, a bridged "T" network band elimination filter in a negative feedback path of said amplifier, and a phase shift correcting capacitor association with said bridged "T" network band elimination filter to effect a phase shift sufficient to maintain an appropriate feedback such that said amplifier is stable,
said at least one amplifier resulting in a gain in excess of 300 and "Q" in excess of 10,
each personal receiver including alarm means associated with the output of said amplifier for indicating an alarm signal has been received.

25. A signalling system for use in alerting miners in underground mines comprising
means for generating an alarm signal at a low frequency by applying the signal to the surface about a mine, and
a plurality of personal receivers each associated with a miner and operable from a portable battery supply carried by the miner, each receiver including an antenna tuned to the particular low frequency of the alarm signal,
a first bandpass amplifier, a mixer having an associated local oscillator, a second bandpass amplifier and detector means for determining whether said alarm signal has been received,
said first and second bandpass amplifiers each comprising a single stage operational amplifier, a bridged "T" network band elimination filter in a negative feedback path of said amplifier, and a phase shift correcting capacitor associated with said bridged "T" network band elimination filter to effect a phase shift sufficient to maintain an appropriate feedback such that said amplifier is stable.

26. A signalling system as claimed in claim 25, wherein said antenna is a tuned ferrite loop tuned in accordance with the characteristics of said first amplifier.

27. A signalling system as claimed in claim 26, wherein said first amplifier amplifies signals have frequency in the range of about 500 Hz to 3000 Hz and provides a gain in excess of 100.

28. A signalling system as claimed in claim 27, wherein said oscillator has a frequency of about 1000 Hz and said second amplifier amplifies the signal having a frequency of about 1650 Hz producing a gain in excess of 200.

29. A signalling system as claimed in claim 28, wherein said first amplifier has a gain in excess of 300 and said second amplifier has a gain in excess of 1000 and each having a "Q" in excess of 30.

30. A signalling system as claimed in claim 25, wherein said receiver shares the power supply provided for a miner's light.

31. In a communication system having at least one transmitter and at least one receiver wherein said receiver comprises an antenna, a first bandpass amplifier, a mixer having associated therewith a local oscillator, a second bandpass amplifier and detector means for determining whether a particular signal has been received, said first and second bandpass amplifiers each comprising a single stage operational amplifier, a bridged "T" network band elimination filter in a negative feedback path of said amplifier, and a phase shift correcting capacitor associated with said bridged "T" network band elimination filter to effect a phase shift sufficient to maintain an appropriate feedback such that said amplifier is stable.

32. In a communication system as claimed in claim 31, wherein said antenna is a tuned ferrite loop tuned in accordance with the characteristics of said first amplifier.

33. In a communication system as claimed in claim 32, wherein said first amplifier amplifies signals have frequency in the range of about 500 Hz to 3000 Hz and provides a gain in excess of 100.

34. In a communication system as claimed in claim 33, wherein said oscillator has a frequency of about 1000 Hz and said second amplifier amplifies the signal having a frequency of about 1650 Hz producing a gain in excess of 200.

35. A receiver as claimed in claim 19, wherein said first amplifier amplifies signals having a frequency in the range of about 500 to 3,000 Hz and provides a gain in excess of 100.

36. A receiver as claimed in claim 19, wherein both said first and second bandpass amplifiers have a gain in excess of 100.

37. A receiver as claimed in claim 19, wherein said first amplifier amplifies signals having a low frequency and provides a gain in excess of 100.

* * * * *